(12) United States Patent
Bansal

(10) Patent No.: US 8,975,920 B2
(45) Date of Patent: Mar. 10, 2015

(54) PROGRAMMABLE TRANSCEIVER CIRCUIT

(75) Inventor: Jai P. Bansal, Manassas, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 79 days.

(21) Appl. No.: 13/584,375

(22) Filed: Aug. 13, 2012

(65) Prior Publication Data
US 2013/0207689 A1    Aug. 15, 2013

Related U.S. Application Data

(60) Provisional application No. 61/522,739, filed on Aug. 12, 2011.

(51) Int. Cl.
*H03K 19/094* (2006.01)
*H03K 3/011* (2006.01)
*H03K 19/0185* (2006.01)

(52) U.S. Cl.
CPC ........ *H03K 3/011* (2013.01); *H03K 19/018585* (2013.01)
USPC ................................ 326/82; 326/26; 326/115

(58) Field of Classification Search
None
See application file for complete search history.

(56) References Cited

U.S. PATENT DOCUMENTS

2011/0012646 A1*    1/2011    Yadav et al. .................. 327/109

\* cited by examiner

*Primary Examiner* — Jany Richardson
(74) *Attorney, Agent, or Firm* — Russell Ng PLLC; Antony Ng; Daniel J. Long

(57) ABSTRACT

A multi-function programmable transceiver is described. The transceiver includes a driver circuit and a receiver circuit, which allows an Application Specific Integrated Circuit (ASIC) device to drive and receive data from other ASIC devices. Both the driver and receiver circuits share a common input/output (I/O) pin. The driver circuit can be programmed to provide one of the several driver functions, such as CMOS, TTL, PCI, HSTL, SSTL and LVDS. Other functional features of the transceiver that can be programmed are driving strengths or output impedance, output power supply voltage, single ended or differential mode of HSTL/SSTL transceivers, and class 1 or class 2 operations for SSTL/HSTL transceivers. The receiver circuit can also be programmed to provide one of the several receiver functions, such as CMOS, TTL, PCI, HSTL, SSTL and LVDS.

8 Claims, 6 Drawing Sheets

US 8,975,920 B2

PROGRAMMABLE TRANSCEIVER CIRCUIT

PRIORITY CLAIM

The present application claims priority under 35 U.S.C. §119(e)(1) to provisional application No. 61/522,739, filed on Aug. 12, 2011, the contents of which are incorporated herein by reference.

STATEMENT OF GOVERNMENT INTEREST

The present invention was made with United States Government assistance under Contract No. 07-C-0371 awarded by classified customer. The United States Government has certain rights in the present invention.

BACKGROUND OF THE INVENTION

1. Technical Field

The present invention relates to receivers and drivers in general, and in particular to a programmable transceiver for Field Programmable Gate Array devices.

2. Description of Related Art

Field Programmable Gate Array (FPGA) devices are commonly employed to implement different functions in various applications. Because of the large numbers of potential applications, FPGA devices will be called upon in various applications to receive input signals from a variety of circuits having different voltage swing standards between logic 1 and logic 0. Similarly, FPGA devices will be called upon in various applications to drive a variety of circuits having output signals that must meet the voltage standards for logic 1 and logic 0 of the circuit being driven. FPGA devices may also need to communicate with other devices that are designed to meet input/output (I/O) specifications at a different power supply voltage.

Suffice to say, it can be very costly and time-consuming to customize each and every I/O buffer for every application. The conventional method is to use several driver and receiver circuits in parallel, and one of the circuits can be selected by using a multiplexor. Such designs tend to require a large amount of silicon chip area, and the operations may have longer signal delays and may dissipate more power than necessary.

Consequently, it would be desirable to provide a transceiver circuit that can be field programmed to meet various requirements of different applications.

SUMMARY OF THE INVENTION

In accordance with a preferred embodiment of the present invention, a transceiver, which includes a driver circuit and a receiver circuit, allows an Application Specific Integrated Circuit (ASIC) device to drive and receive data from other ASIC or Field Programmable Gate Array (FPGA) devices. Both the driver and receiver circuits share a common input/output (I/O) pin. The driver circuit can be programmed to provide one of the several driver functions, such as CMOS, TTL, PCI, HSTL, SSTL and LVDS. Other functional features of the transceiver that can be programmed are driving strengths, output impedance, output power supply voltage, single ended or differential mode of HSTL/SSTL transceivers, and class 1 or class 2 operations for SSTL/HSTL transceivers. The receiver circuit can also be programmed to provide one of the several receiver functions, such as CMOS, TTL, PCI, HSTL, SSTL and LVDS.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1:
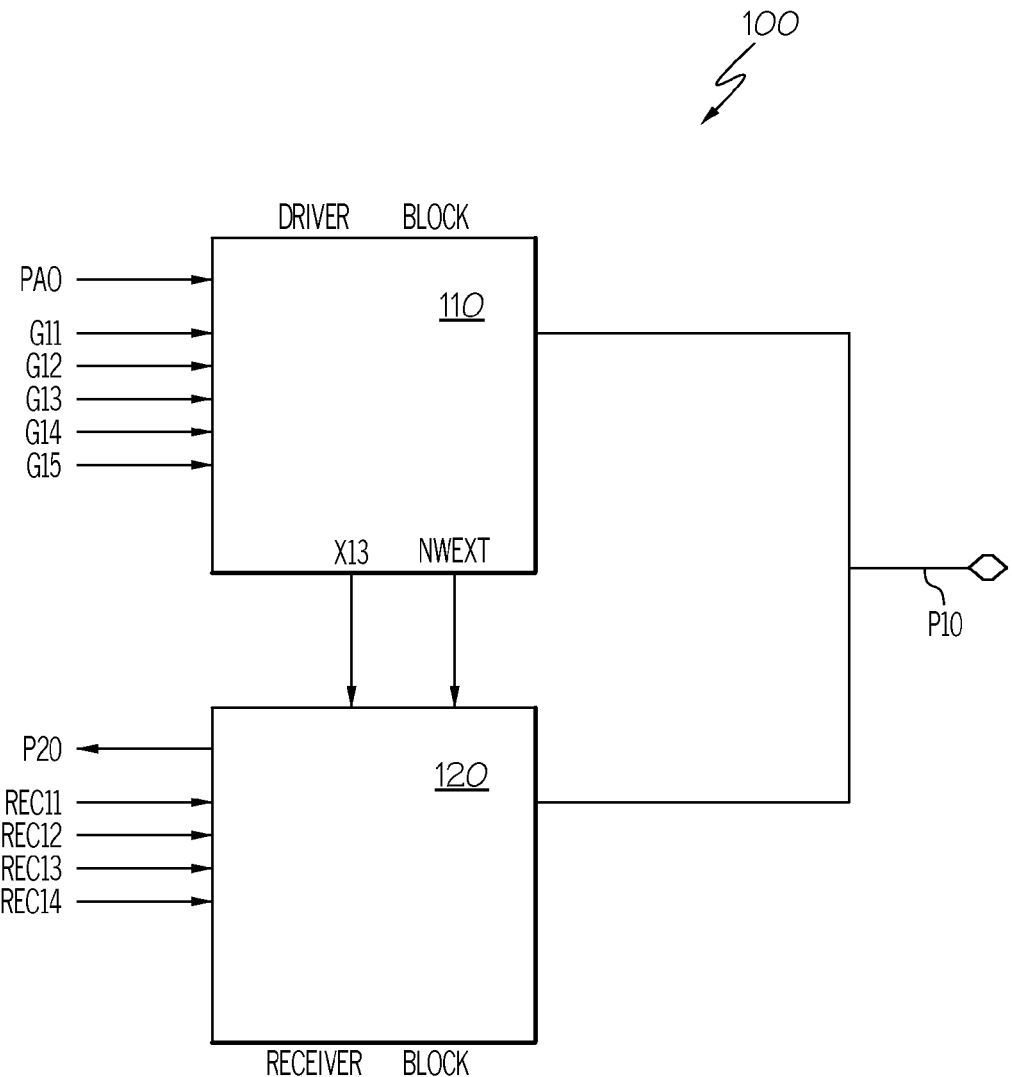
FIG. 1 is a block diagram of a programmable transceiver, in accordance with a preferred embodiment of the present invention.

Referring now to the drawings and in particular to FIG. 1, there is illustrated a block diagram of a programmable transceiver, in accordance with a preferred embodiment of the present invention. As shown, a transceiver 100 includes a driver block 110 and a receiver block 120. Driver block 110 includes a driver input PA0 and programming (control) inputs G11-G15. Similarly, receiver block 120 includes a receiver output P20 and programming (control) inputs REC11-REC14. Both driver block 110 and receiver block 120 share a common input/output (I/O) pin P10. An N-well bias signal, NWext, which is generated by driver block 110, is also connected to receiver block 120. An X13 signal, which is generated by driver block 110, goes to a CMOS switch within both driver block 110 and receiver block 120. This CMOS switch isolates the pre-driver circuits in the driver and receiver functions from the voltage at an external primary I/O pin in cold spare applications.

Figure 2:
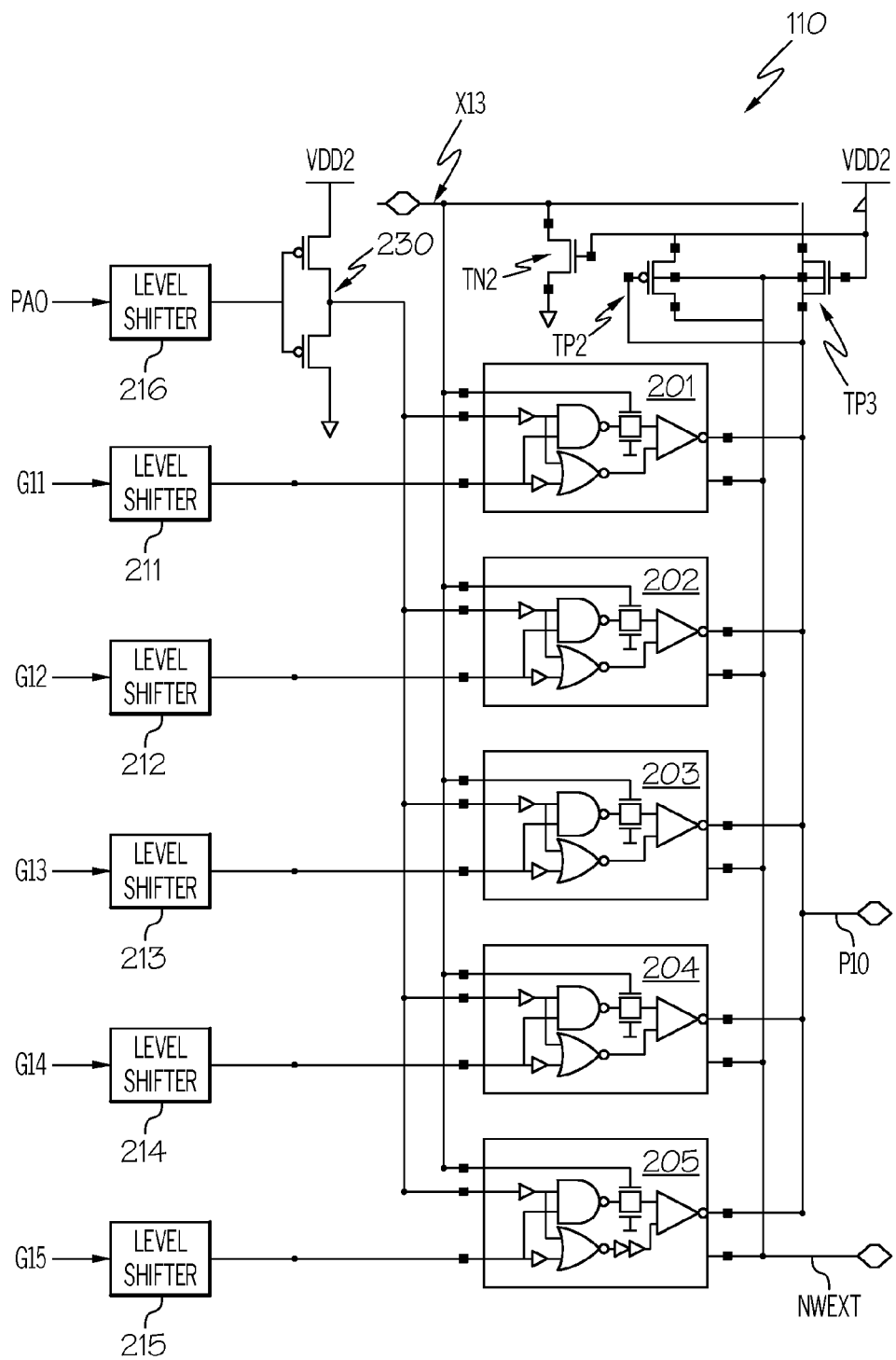
FIG. 2 is a circuit diagram of a driver block within the transceiver from FIG. 1.

With reference now to FIG. 2, there is depicted a circuit diagram of driver block 110, in accordance with a preferred embodiment of the present invention. As shown, driver block 110 includes five separate circuit paths 201-205 connected in parallel with each other, from driver input PA0 to transceiver I/O pin P10. Level shifter 216 is provided to shift the levels of input data PA0, and level shifters 212-215 are provided to shift the levels of programming inputs G11-G15, respectively. Each of circuit paths 201-205 can be individually programmed to an active mode or tri-state (Hi-Z) mode via programming inputs G11-G15, respectively. Each of circuit paths 201-205 may be designed to provide one of the four units of driving strengths measured in terms of source and sink current at specified output up level and down level limits. For example, circuit path 201 may be designed to meet up and down levels at 16 mA source and sink currents, respectively. Similarly, circuit path 202 may be designed to meet up and down levels at 12 mA source and sink currents, respectively; circuit path 203 may be designed to meet up and down levels at 8 mA source and sink currents, respectively; and circuit path 204 may be designed to meet up and down levels at 6 mA source and sink currents, respectively. Circuit path 205 may be designed for LVDS driver function only.

Various combinations of one or more circuit paths 201-205 can provide a very large range of driving strengths that can be specified in terms of source and sink currents at I/O pin P10 or in terms of driver circuit output impedance. For example, if circuit paths 201, 202, 203 and 204 provide 16 mA, 12 mA, 8 mA and 6 mA, respectively, then driver block 110 can provide a driving strength of 24 mA source and sink currents by enabling circuit paths 201 and 203 in active mode while placing circuit paths 202, 204 and 205 in tri-state mode.

In many applications, the core logic of an ASIC or FPGA device is operated at a lower power voltage than the power supply voltage for the I/O buffer circuit in order to lower power dissipation and to achieve higher circuit density. In those applications, signals from core logic are shifted from lower voltage level to I/O power supply voltage levels.

Although circuit paths 201, 202, 203 and 204 are capable of providing 16 mA, 12 mA, 8 mA and 6 mA, respectively, at a high end of the driver power supply voltage of, for example, 3.3 V, source and sink currents that circuit paths 201-204 can support will be lower at a lower power supply voltage such as 2.5 V or 1.8 V. By putting more circuit paths 201-204 in active state, driver block 110 can meet the output up and down level specifications at the required source and sink currents. Table I depicts the relationships among power supply voltage (VDD2), source/sink current ($I_{high}/I_{low}$) and circuit paths in active state or Hi-Z state.

TABLE I

| VDD2 (V) | $I_{high}/I_{low}$ (mA) | circuit paths in active state | circuit paths in Hi-Z state |
|---|---|---|---|
| 3.3 | 24 | 201, 203 | 202, 204, 205 |
| 3.3 | 20 | 202, 203 | 201, 204, 205 |
| 3.3 | 16 | 201 | 202, 203, 204, 205 |
| 3.3 | 12 | 202 | 201, 203, 204, 205 |
| 3.3 | 8 | 203 | 201, 202, 204, 205 |
| 3.3 | 6 | 204 | 201, 202, 203, 205 |
| 3.3 | 4 | 204 | 201, 202, 203, 205 |
| 2.5 | 24 | 201, 203, 204 | 202, 205 |
| 2.5 | 20 | 201, 203 | 202, 204, 205 |
| 2.5 | 16 | 202, 203 | 201, 204, 205 |
| 2.5 | 12 | 201 | 202, 203, 204, 205 |
| 2.5 | 8 | 202 | 201, 203, 204, 205 |
| 2.5 | 6 | 203 | 201, 202, 204, 205 |
| 2.5 | 4 | 204 | 201, 202, 203, 205 |
| 1.8 | 20 | 201, 202, 203, 204 | 205 |
| 1.8 | 16 | 201, 202, 203 | 204, 205 |
| 1.8 | 12 | 201, 202 | 203, 204, 205 |
| 1.8 | 8 | 202, 204 | 201, 203, 205 |
| 1.8 | 6 | 202 | 201, 203, 204, 205 |
| 1.8 | 4 | 203 | 201, 202, 204, 205 |

In applications where it is not practical to replace hardware when a device stops functioning properly, spare parts are wired in parallel with the active parts are switched on in active state via a software instruction and the part that has gone bad is switched off. This capability is known as cold spare characteristics of the device. In cold spare mode, power supply to the ASIC or FPGA device is turned off, but its inputs and outputs that are connected in parallel to the active ASIC or FPGA device will be switching.

In driver block 110, inverter buffer circuit 230 reduces the load on level shifter 216. Transistor TP2 generates n-well bias voltage NWext for circuit paths 201-205. In cold spare mode when I/O pin P10 is at driver power supply and its own power supply is at 0 V, transistor TP3 will conduct and transistor TN2 will not conduct. The drain voltage of TN2 or node X13 will be at I/O pin P10 signal voltage level.

Figure 3A:
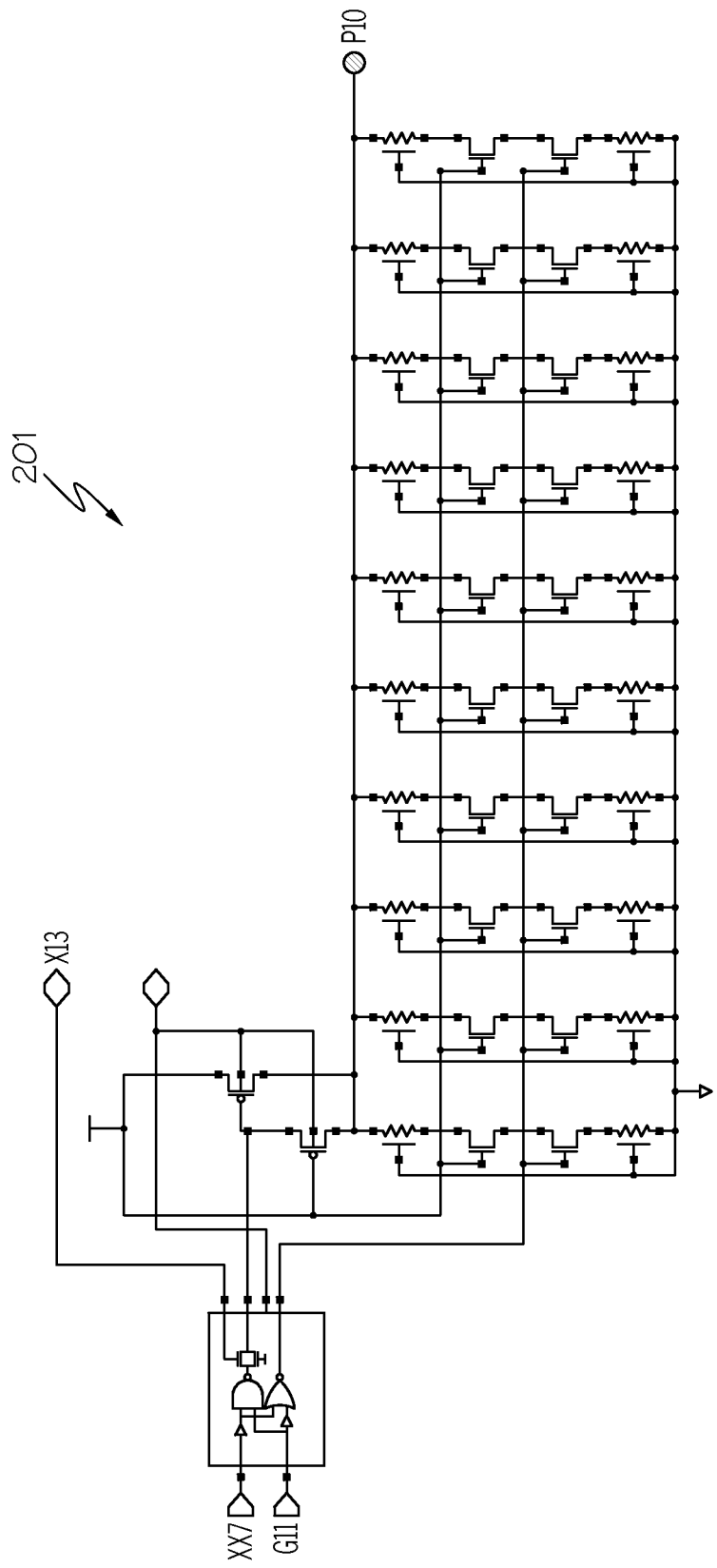
FIG. 3a is a circuit diagram of a circuit path within the driver block from FIG. 2.
Figure 3B:
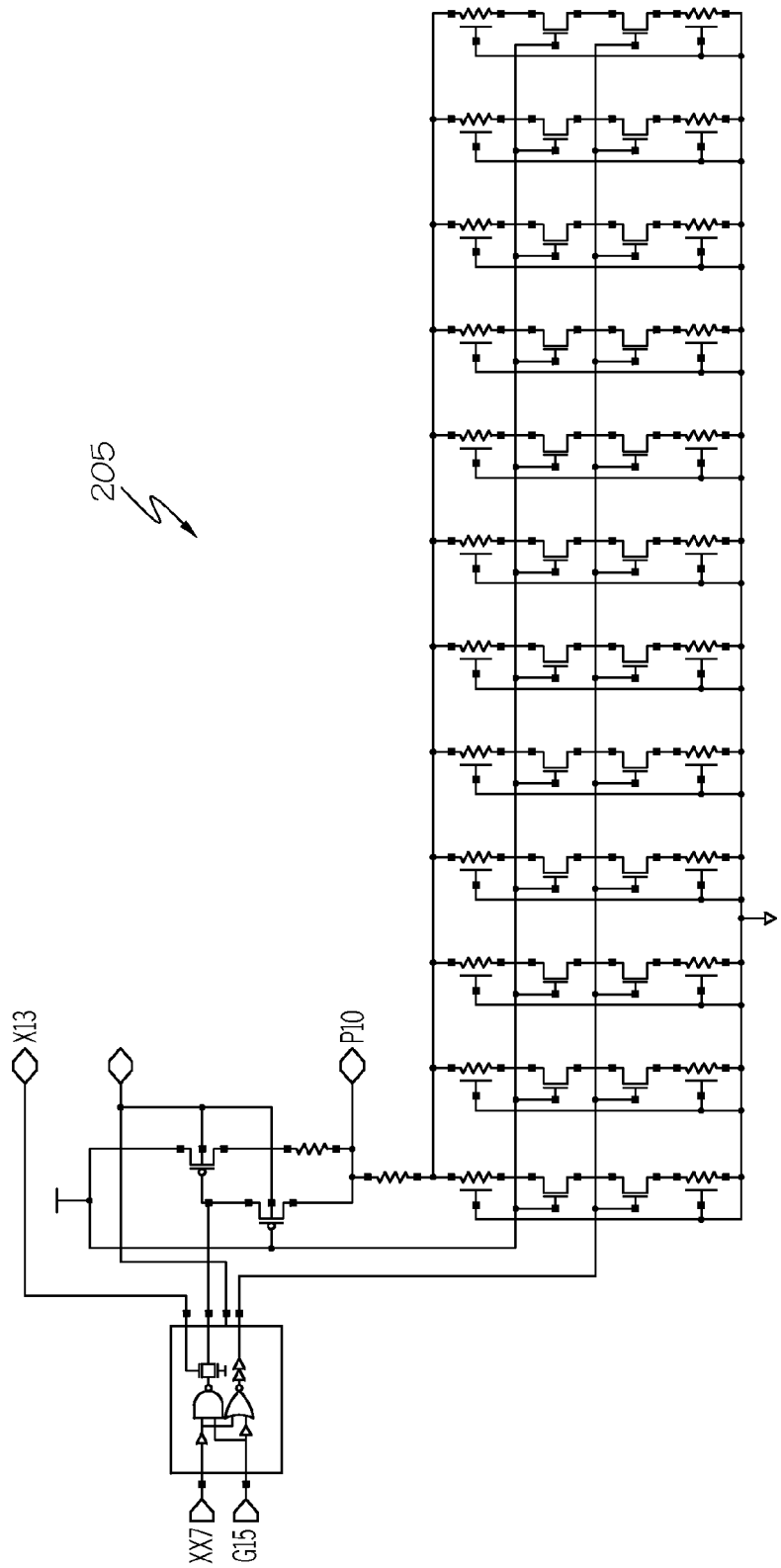
FIG. 3b is a circuit diagram of a LVDS driver circuit path within the driver block from FIG. 2.

Referring now to FIG. 3a, there is illustrated a circuit diagram of circuit path 201. The pre-driver circuit may be implemented with multiple transistors to provide multiple input nodes. The pre-driver circuit can put this path in active or tri-state mode. In one embodiment, a selection of the transistors can program slew rate control with multiple programming inputs, for circuit path 201. One pair of transistors can isolate the output stage from the pre-driver circuit mentioned above. In cold spare mode, X13 will be high (=driver power supply) as mentioned above, and driver power supply will be equal to 0V. Output stage transistors are sized to provide desired source and sink currents, for example 16 mA at high end of the driver power supply voltage, when circuit path 201 is in active mode. Each of circuit paths 202-204 has incrementally more transistors than those in circuit path 201 to provide more driving power.

Referring now to FIG. 31b, there is illustrated one embodiment of LVDS driver circuit path 205. Circuit path 205 is specifically designed to meet LVDS specifications. Circuit path 205 may be designed in the same manner as circuit path 201-204 except the output stage transistors may be sized to provide lower source and sink currents in an incremental manner. Its output voltage level is adjusted with R1 series resistor between drain of pull up transistor and I/O pin P10 and R2 series resistor between drain of pull down transistor and I/O pin P10.

Figure 4:
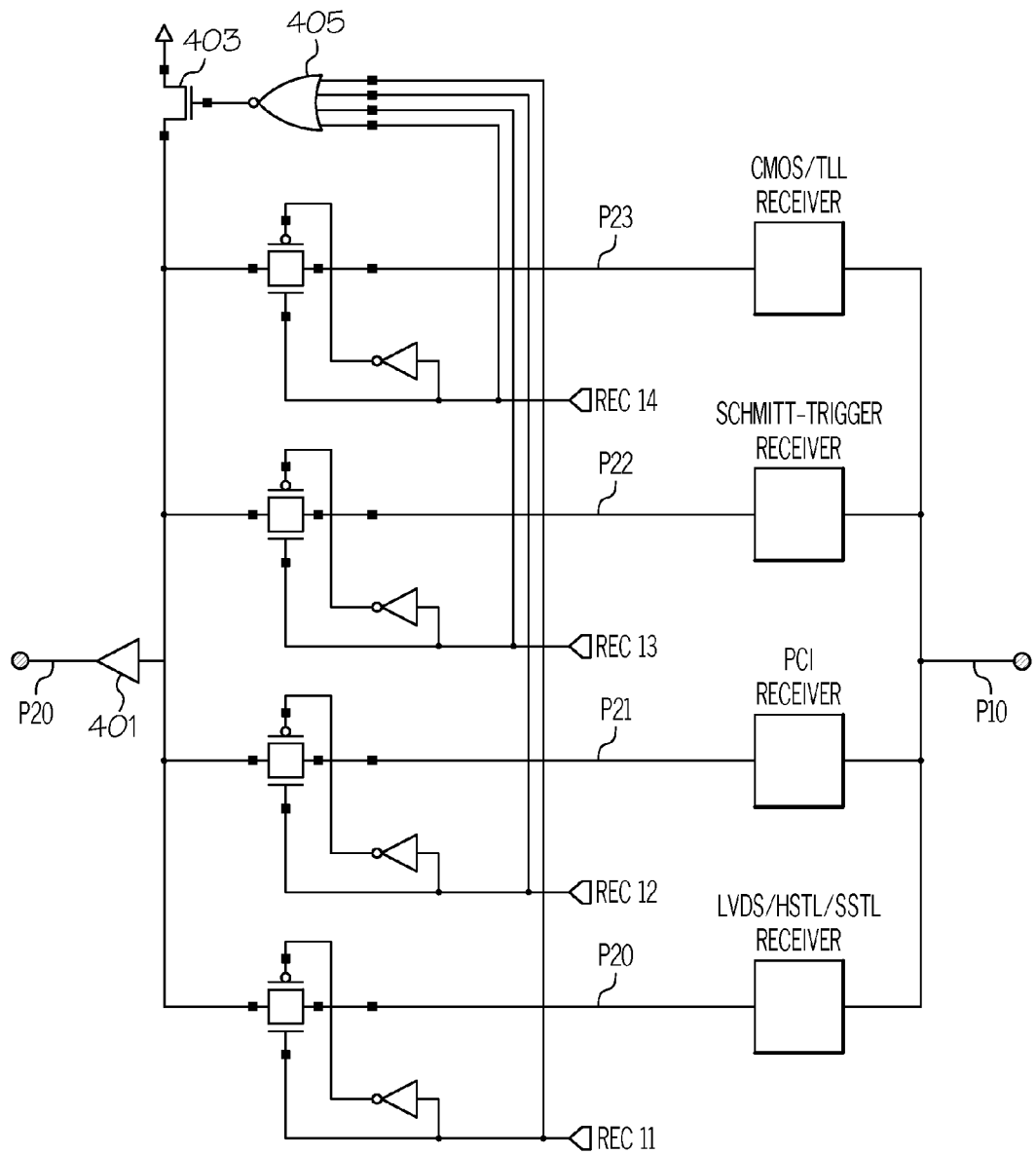
FIG. 4 is a circuit diagram of a receiver block within the transceiver from FIG. 1.

With reference now to FIG. 4, there is depicted a circuit diagram of receiver block 120 from FIG. 1, in accordance with a preferred embodiment of the present invention. A required receiver function can be selected via programming inputs REC11-REC14. LVDS receiver is a differential receiver with inputs from two drivers as positive and negative inputs for differential mode, or positive and $V_{ref}$ applied to a negative input for single ended mode. LVDS receiver function can be selected by applying a high logic level at REC11 and a low logic level at REC12, REC13 and REC14. PCI receiver function can be selected by applying a high logic level at REC12 and a low logic level at REC11, REC13 and REC14. Schmitt-Trigger receiver function can be selected by applying a high logic level at REC13 and a low logic level at REC11, REC12 and REC14. CMOS/TTL receiver functions can be selected by applying a high logic level at REC14 and a low logic level at REC11, REC12 and REC13.

The selected receiver function passes through a 4:1 multiplexor and then through a buffer circuit that is common to all the receiver functions. All receiver functions can be inhibited by applying a low logic level at REC11-REC14, and NOR circuit 405 will generate a logic high level at its output to turn on transistor 403, which will produce a logic high level at output P20 of a buffer 401. No logic node within receiver block 120 floats whether or not a receiver function has been selected.

Once the corresponding driver and receiver functions in transceiver 100 have been selected, transceiver 100 is ready to communicate in bi-directional mode with other ASIC and/or FPGA devices. When transceiver 100 is in driving (or sending) mode, driver block 110 is set to active mode while receiver block 120 is set to inactive mode. When transceiver 100 is in receiving mode, driver block 110 is set to Hi-Z mode, and receiver block 120 is set to receiving mode. Transceiver 100 can be programmed for any of the functions listed in Table II.

TABLE II

| I/O Type | Power Supplies | Programmable Features |
| --- | --- | --- |
| LVTTL transceiver | 1.5 V/3.3 V | Driving strengths = 4, 6, 8, 12, 16, 20, 24 mA |
| LVCMOS transceiver | 1.5 V/3.3 V | Driving strengths = 4, 6, 8, 12, 16, 20, 24 mA |
| LVTTL transceiver | 1.5 V/2.5 V | Driving strengths = 4, 6, 8, 12, 16, 20, 24 mA |
| LVTTL transceiver | 1.5 V/1.8 V | Driving strengths = 4, 6, 8, 12, 16, 20 mA |
| Schmitt Trigger receiver | 1.5 V/3.3 V | can be selected for any transceiver |
| Schmitt Trigger receiver | 1.5 V/2.5 V | can be selected for any transceiver |
| Schmitt Trigger receiver | 1.5 V/1.8 V | can be selected for any transceiver |
| PCI 33 MHz, transceiver | 1.5 V/3.3 V | PCI standard |
| PCI 66 MHz, transceiver | 1.5 V/3.3 V | PCI standard |
| LVDS driver | 1.5 V/2.5 V | TIA standards |
| LVDS receiver | 1.5 V/3.3 V | TIA standards |
| LVDS receiver | 1.5 V/2.5 V | TIA standards, HSTL and SSTL applications |
| LVDS receiver | 1.5 V/1.8 V | HSTL and SSTL applications |

Figure 5:
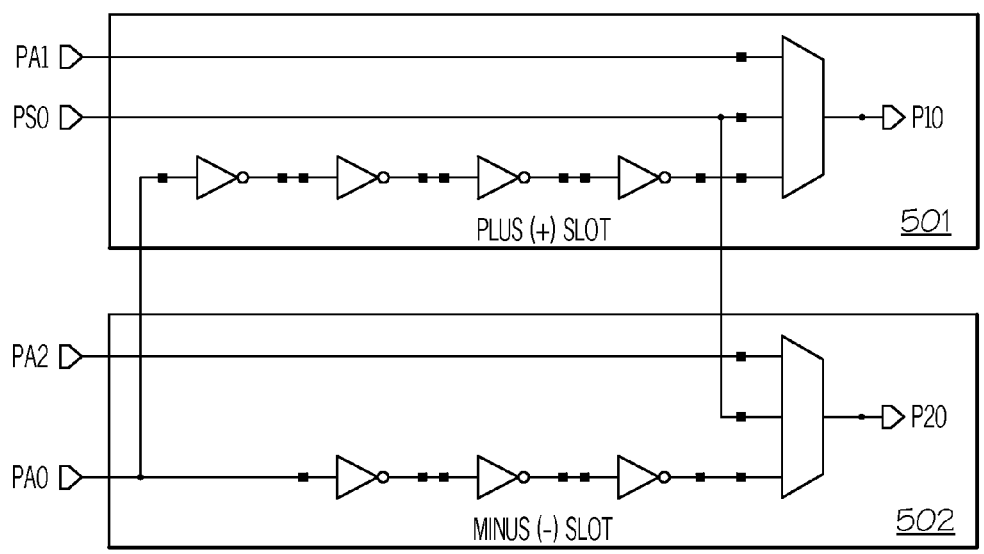
FIG. 5 is a block diagram of a differential transceiver function.

Referring now to FIG. 5, there is illustrated a method for selecting a single-ended mode or a differential mode. In high-speed transceiver functions such as LVDS, differential mode SSTL and differential mode HSTL true and complement logic levels are generated from a single data input. For single-ended mode, a programming input PS0 is set at a low logic level. Driver data inputs are applied to inputs PA1 and PA2. The outputs of mode selection blocks 501 and 502 at P10 and P20, respectively, become inputs to the two individual drivers such as the one shown in FIG. 2. For differential mode, programming input PS0 is set at a high logic level, and the input to mode selection blocks 501 and 502 is PA0. P10 of mode selection block 501 will produce an in-phase output at P10, and mode selection block 502 will produce an out-of-phase output at P20. These two signals are applied to the inputs of drivers in two adjacent transceiver circuits.

As has been described, the present invention provides an improved transceiver having a driver block and a receiver block. The driver block can be constructed by implementing multiple signal paths needed for maximum driving strength at minimum power supply voltage with four incremental driving strengths CMOS circuit paths and one LVDS driver circuit path in parallel from a driver input to a driver output. In active state, high driving strengths use more of the CMOS circuit paths and low driving strengths use less of the CMOS circuit paths. The transceiver may also be used in cold spare applications, which means its power supply voltage will be approximately 0 V while its I/O pin will be switching from ground to power supply voltage.

While the invention has been particularly shown and described with reference to a preferred embodiment, it will be understood by those skilled in the art that various changes in form and detail may be made therein without departing from the spirit and scope of the invention.

What is claimed is:

1. A transceiver comprising:
    a driver circuit having
        a data input, a data output and a plurality of control inputs;
        a plurality of circuit paths each having incremental driving strengths, wherein each of said circuit paths includes different numbers of transistors to provide said incremental driving strengths; and
        a LVDS driver circuit connected in parallel with said plurality of circuit paths; and
    a receiver circuit having said data output of said driver circuit as data input, and a data output.

2. The transceiver of claim 1, wherein each of said circuit paths is set to provide a corresponding low-to-high source/sink current in response to a different power supply voltage.

3. The transceiver of claim 1, wherein each of said circuit path is set to an active state or a high-impedance state to minimize switching power dissipation for a given transceiver function.

4. The transceiver of claim 1, wherein said receiver circuit is configured to provide one of the functions selected from the group consisting of CMOS, TTL, PCI, HSTL, SSTL, and LVDS.

5. The transceiver of claim 1, wherein each of said circuit paths is connected to a corresponding level shifter.

6. A transceiver comprising:
    a driver circuit having
        a data input, a data output and a plurality of control inputs;
        a plurality of circuit paths each having incremental driving strengths, wherein said circuit paths are configured to drive CMOS, TTL, PCI, HSTL or SSTL circuits; and
        a LVDS driver circuit connected in parallel with said plurality of circuit paths, wherein said LVDS driver circuit is configured to only drive LVDS circuits, wherein said driver circuit is configured to provide one of the functions selected from the group consisting of CMOS, TTL, PCI, HSTL, SSTL, and LVDS; and
    a receiver circuit having said data output of said driver circuit as data input, and a data output.

7. A transceiver comprising:
    a driver circuit having
        a data input, a data output and a plurality of control inputs;
        a plurality of circuit paths each having incremental driving strengths, wherein one of said circuit paths includes a pre-driver circuit having a plurality of transistors to provide multiple input nodes; and
        a LVDS driver circuit connected in parallel with said plurality of circuit paths; and
    a receiver circuit having said data output of said driver circuit as data input, and a data output.

8. The transceiver of claim 7, wherein said pre-driver circuit places said circuit path in an active or tri-state mode.

* * * * *